United States Patent
Dinger et al.

(10) Patent No.: US 8,354,032 B2
(45) Date of Patent: Jan. 15, 2013

(54) METHOD OF MANUFACTURING A MICROMECHANICAL PART

(75) Inventors: Rudolf Dinger, Saint-Aubin (CH); Thierry Ravenel, Hauterive (CH)

(73) Assignee: The Swatch Group Research and Development Ltd, Marin (CH)

( * ) Notice: Subject to any disclaimer, the term of this patent is extended or adjusted under 35 U.S.C. 154(b) by 671 days.

(21) Appl. No.: 12/500,982

(22) Filed: Jul. 10, 2009

(65) Prior Publication Data
US 2010/0005659 A1  Jan. 14, 2010

(30) Foreign Application Priority Data

Jul. 10, 2008  (EP) ..................................... 08160143

(51) Int. Cl.
*C23F 1/00* (2006.01)
(52) U.S. Cl. .................. 216/2; 216/39; 216/41; 216/67; 216/74; 29/896.31
(58) Field of Classification Search .......................... None
See application file for complete search history.

(56) References Cited

U.S. PATENT DOCUMENTS

| | | | |
|---|---|---|---|
| 6,869,676 B2* | 3/2005 | Burger et al. ................ | 428/336 |
| 2008/0198702 A1* | 8/2008 | Meister et al. ................ | 368/232 |
| 2010/0054092 A1* | 3/2010 | Marmy et al. ................ | 368/324 |

FOREIGN PATENT DOCUMENTS

| | | |
|---|---|---|
| JP | 11-48342 | 2/1999 |
| WO | WO2006122873 | * 11/2006 |
| WO | WO2008055844 | * 5/2008 |

OTHER PUBLICATIONS

M. Madou, Fundamentals of Microfabrication, CRC Press, 1997, ISBN 0-8493-9451-1, pp. 2-9.*
A. Perret et al., Proceedings of SPIE, vol. 4755, 2002, pp. 645-647.*
Gluche et al., MST News, No. 3/08, 2008, pp. 15-17.
Office Action issued in co-pending related U.S. Appl. No. 12/501,009 on Jun. 5, 2012.
Perret A: "Le Silicum comme materiau dans la fabrication de pieces mecaniques," Bulleting de la Societe Suisse de Chronometrie, SSC, Neuchatel, CH, No. 38, Nov. 9, 2001, pp. 27-29.
Database WPI Week 199918, Thomson Scientific, London, GB; AN 1999-209545 (as cited in the European Search Report. Abstract of foreign patent reference 1 cited above).
European Search Report issued in corresponding application No. EP 08 16 0143, completed Feb. 2, 2009.
Noel W et al., "MEMS for watches," Micro Electro Mechanical Systems, 2004. 17th IEEE International Conference on (MEMS) Maastricht, Netherlands,, Jan. 25, 2004, pp. 1-4.

* cited by examiner

*Primary Examiner* — Lan Vinh
*Assistant Examiner* — Jiong-Ping Lu
(74) *Attorney, Agent, or Firm* — Griffin & Szipl, P.C.

(57) ABSTRACT

A method of manufacturing a mechanical part includes providing a substrate of micro-machinable material; etching, using photolithography, a pattern that includes said part through said entire substrate; assembling a clip on said part so that said part is ready to be mounted without the portion made of micro-machinable material having to be touched by a tool other than the clip; releasing the part from the substrate so as to mount said part in a device such as a timepiece movement.

23 Claims, 7 Drawing Sheets

METHOD OF MANUFACTURING A MICROMECHANICAL PART

This application claims priority from European Patent Application No. 08160143.7 filed Jul. 10, 2008, the entire disclosure of which is incorporated herein by reference.

FIELD OF THE INVENTION

The invention relates to a method of manufacturing a mechanical part made from a micro-machinable material and, more specifically, a part of this type that will be used for manufacturing a timepiece.

BACKGROUND OF THE INVENTION

Manufacturing a timepiece part in a crystalline, silicon-based material is known. Indeed, the use of a micro-machinable like crystalline silicon has advantages in terms of manufacturing precision, owing to advances in current methods particularly within the electronics field. Thus, while it may be possible to manufacture balance springs, it is not yet possible to apply micro-machinable materials to all timepiece parts because of their insufficient tribological properties. Moreover, current manufacturing methods remain complex to implement and require direct handling of the manufactured parts, at the risk of damage to such parts.

SUMMARY OF THE INVENTION

It is an object of the present invention to overcome all or part of the aforecited drawbacks by proposing a method that allows, simple, reliable pre-assembly of the part preventing any handling of the functional portions thereof so that the part is ready to be mounted in a device, such as a timepiece, without having to be touched. Moreover, the method allows high quality manufacture of a micromechanical part that can be applied to most mechanical timepiece parts.

The invention therefore relates to a method of manufacturing a mechanical part including the following steps:
a) providing a substrate made of micro-machinable material;
b) etching, with help of photolithography, a pattern that includes said part through said entire substrate;
characterized in that it further includes the following steps:
c) assembling a clip on said part so that the latter is ready to be mounted without the portion made of micro-machinable material having to be touched;
d) releasing the part from the substrate so as to mount it in a device such as a timepiece movement.
According to other advantageous features of the invention:
step c) includes these steps: e) mounting said substrate on a support fitted with forks, so that the forks cooperate with said part and f) assembling the clip on the part mounted against the support;
step e) includes these steps: g) guiding the substrate relative to said support using alignment means so as to orient said substrate reliably and h) sliding the substrate and the part respectively against at least one pin and the forks secured to the support so as to abut against a shoulder of said at least one pin and said forks respectively, in order to prepare for assembly of the clip;
the alignment means are located higher than said at least one pin and said forks so as to guarantee the consecutiveness of steps g) then h);
the support includes several alignment means so as to improve the guiding of step g);
the method further includes, between steps b) and c), these steps: i) mounting said etched substrate on a base so as to leave the top and bottom surfaces thereof accessible, and j) depositing a coating of better tribological quality than said micro-machinable material on the external surface of said part;
step h) includes these steps: k) guiding the substrate relative to said base using alignment means so as to orient said substrate reliably and l) sliding the substrate against at least one pin secured to the support so that the substrate abuts against a shoulder of said at least one pin made at a distance from said support so as to keep the substrate high relative to said support;
the alignment means are located higher than said at least one pin so as to guarantee the consecutiveness of steps k) then l);
the support includes several alignment means so as to improve the guiding in step k);
during step b), at least one bridge of material is etched in the pattern so as to keep the part secured to the substrate;
said at least one bridge of material includes a narrow section at the end of said part connected to the pattern for creating a zone of weakness that can facilitate step e);
step d) is made by relative movement between the part and the substrate so as to break said at least one bridge of material;
several parts are manufactured from the same substrate;
said micro-machinable material is selected from the group including crystalline silicon, crystalline silica and crystalline alumina.

BRIEF DESCRIPTION OF THE DRAWINGS

Other features and advantages will appear more clearly from the following description, given by way of non-limiting indication, with reference to the annexed drawings, in which.

DETAILED DESCRIPTION OF PREFERRED EMBODIMENTS

Figure 7:
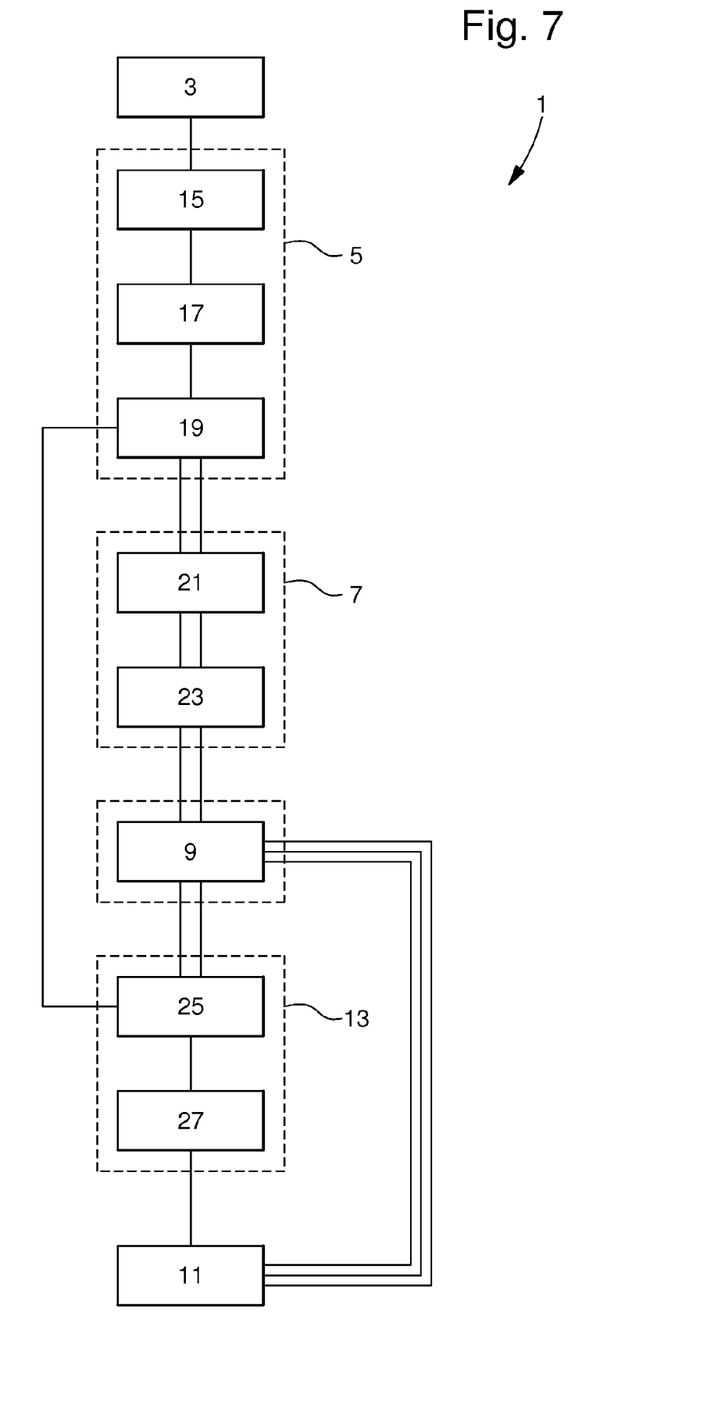
FIG. 7 is a flow chart of the method of the invention.

The example illustrated in FIG. 7 shows the flow chart of a method that is generally designated 1. Method 1 mainly includes 6 steps 3, 5, 7, 9, 11 and 13 for manufacturing a mechanical part 51, whose core is made from a base of micro-machinable material. Indeed, a micro-machinable material, because of its precision of less than a micrometer, is particularly useful for manufacturing a part, for example, of a timepiece and advantageously replaces the metal material that is usually used.

In the following explanation, the micro-machinable material may be crystalline silicon based like, for example, mono-crystalline silicon, crystalline silica, like quartz, or crystalline alumina, like corundum (also called synthetic sapphire). Evidently, other micro-machinable materials could be envisaged.

Step 3 consists in taking a substrate 53, made of micro-machinable material like, for example, a mono-crystalline silicon wafer used for manufacturing electronic components. Preferably, a thinning phase is provided in step 3 so as to adapt the final thickness of part 51. This phase may be achieved by a mechanical or chemical back lapping technique.

Step 5 consists in making a pattern 50, which includes the mechanical part 51 to be manufactured, through the entire substrate 53, by photolithography, then etching. Advantageously, as can be seen in FIGS. 1 and 2, the larger size of substrate 53 relative to that of part 51 allows several patterns 50 to be etched and thus several parts 51 to be manufactured from the same substrate 53.

Figure 1:
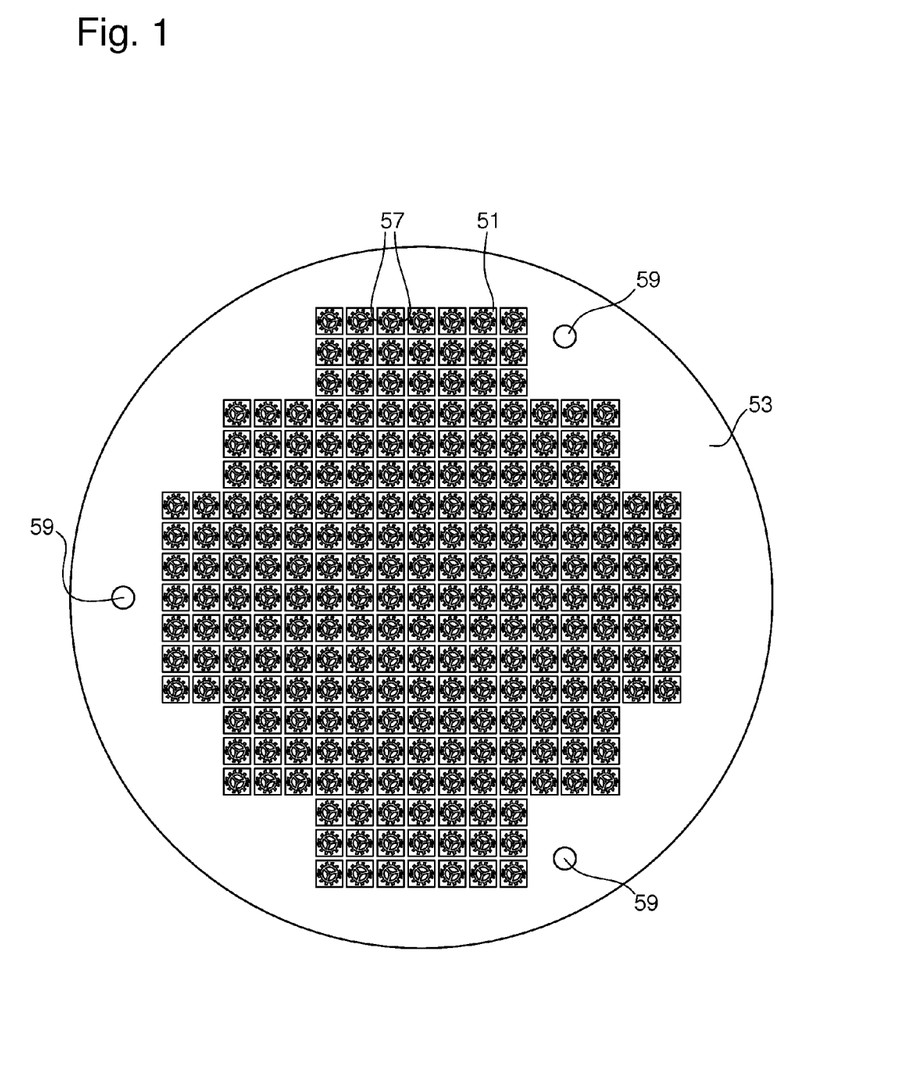
FIG. 1 is a diagram of a substrate after a photolithography and etch step.
Figure 2:
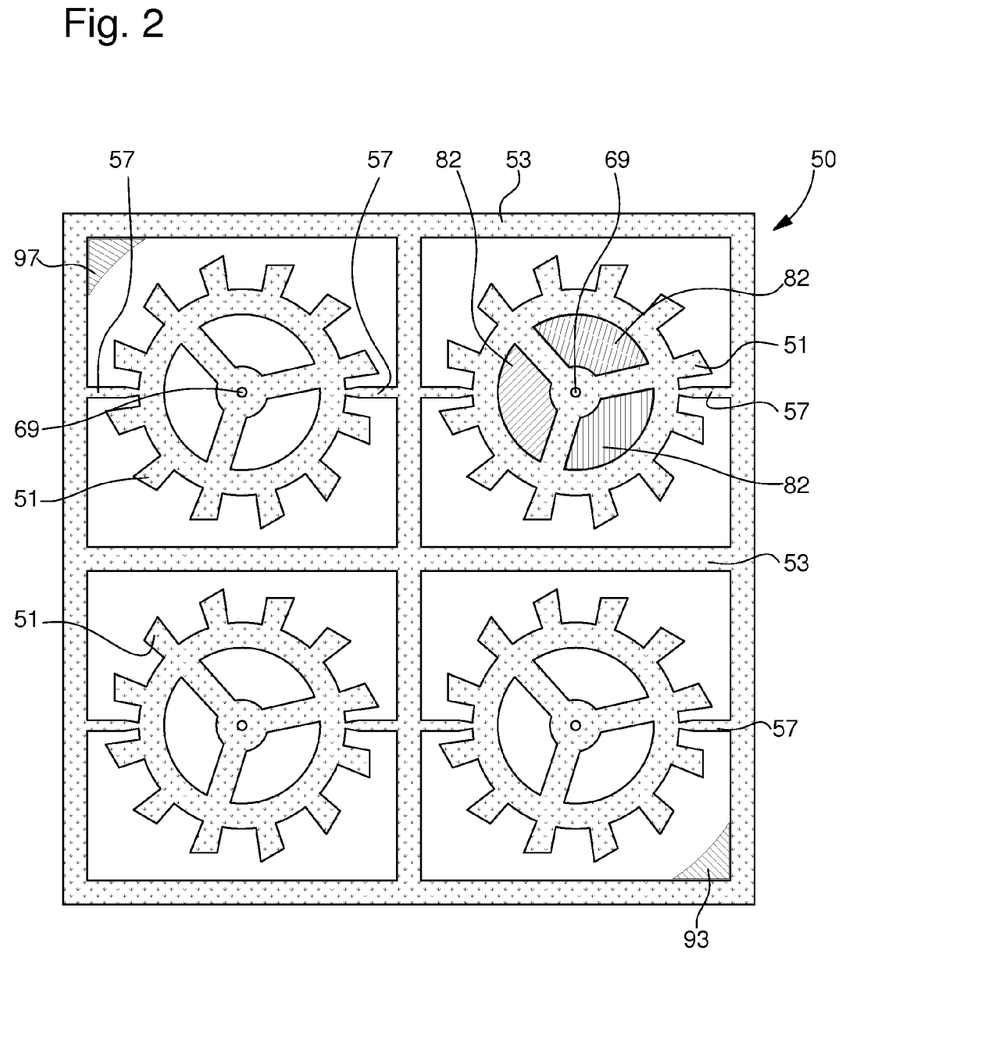
FIG. 2 is an enlargement of one part of FIG. 1.

In the example illustrated in FIGS. 1 and 2, each mechanical part 51 is an escape wheel for a timepiece. Of course, method 1 allows other timepiece parts to be manufactured, but also, as explained below, several different parts on the same substrate 53.

Step 7 consists in mounting the etched substrate 53, on a base 55, so as to leave its top and bottom surfaces accessible. This step facilitates implementation of step 9, which consists in depositing a coating of better tribological quality than said micro-machinable material on the external surface of part 51. Indeed, placing substrate 53 higher than base 55 facilitates deposition of the coating in that it allows the top, thickness and bottom of each part 51 to be accessed.

Step 9 allows deposition of a coating that advantageously replaces any insufficient tribological qualities of the micro-machinable material.

This coating may, for example, be carbon allotrope based. One could also envisage depositing a crystalline carbon coating like synthetic diamond by chemical phase deposition (CVD). Amorphous carbon such as diamond-like-carbon (DLC) could also be deposited by phase vapour deposition (PVD). Of course, one or several other materials could be used as a replacement or addition to carbon. Other deposition methods could also be envisaged.

Step 13 consists in assembling a clip 91 on the part 51 using a support 81 so that the pre-assembled part 51 is ready to be mounted without the part made of micro-machinable material having to be touched.

Step 11 consists in releasing each part 51 from substrate 53. Thus, in the example illustrated in the Figures, according to method 1, several dozen mechanical parts 51 can be obtained on the same substrate 53. In the example illustrated in FIGS. 1 to 6, one could thus obtain, for example, escape wheels whose core is made of mono-crystalline silicon and, in accordance with the embodiments explained below, which include an external surface made of synthetic diamond and/or a pre-assembled clip 91.

From the main steps 3, 5, 7, 9, 11 and 13 each of the embodiments will now be explained. In a first embodiment, method 1 includes the consecutive steps 3, 5, 13 and 11 illustrated by a single line in FIG. 7. The first step 3 consists in taking a substrate 53 made of micro-machinable material.

Then the second step 5 consists in making patterns 50, each including a mechanical part 51 to be manufactured, through the entire substrate 53 by photolithography then etching. According to the first embodiment illustrated in the flow chart of FIG. 7, the second step 5 includes three phases 15, 17 and 19.

In a first phase 15, a protective mask is structured on substrate 53. Preferably, the protective mask is made using a photosensitive resin. The protective mask is thus formed using selective radiation for structuring said mask in a shape corresponding to each pattern 50 to be made. Because of this step 15, it will be possible to etch any flat shape selectively on substrate 53 in a very precise manner.

In a second phase 17, an anisotropic etch of the substrate 53—protective mask assembly is performed. A deep reactive ionic etch (DRIE) is preferably used. The anisotropic etch can etch substrate 53 in an approximately rectilinear manner in the zones that are not protected by said protective mask. The etch during second phase 17 is preferably carried out over the entire thickness of substrate 53 and, possibly, along a crystallographic axis of the micro-machinable material that is favourable to such etch.

Moreover, according to the invention, each pattern 50, as illustrated in FIGS. 1 and 2, preferably has two bridges of material 57. These bridges enable part 51 to be held in place relative to substrate 53 until step 11. As visible in FIG. 2, bridges of material 57 include a narrow section at the end connected to the pattern of part 51 for creating a zone of weakness that can facilitate release step 11.

Finally, according to the first embodiment, the second phase 17 is also used for etching holes 59, forming a part of the alignment means, in substrate 53. In the example illustrated in FIG. 1, it can be seen that three holes 59 have been formed, distributed at approximately 120 degrees from each other and in proximity to the ends of substrate 53.

In a third and last phase 19 of second step 5, the protective mask is removed from the surface of substrate 53. A substrate 53 is then obtained that includes several patterns 50 including a part 51 secured to substrate 53 by two bridges of material 57 as illustrated in FIGS. 1 and 2. Of course, in step 5, one could envisage making a single bridge of material 57 or more than two.

According to the first embodiment, the third step 13 consists in assembling a clip 91 to part 51 using a support 81 so that the pre-assembled part 51 is ready to be mounted without the part made of micro-machinable material having to be touched. Step 13 includes phases 25 and 27.

The first phase 25 consists in mounting substrate 53 onto a support 81, fitted with forks 87, so that the teeth 82 of one fork 87 cooperate with each part 51 and thus facilitate the assembly of clip 91. As visible in FIG. 5, first of all by moving substrate 53 closer to support 81 along direction D, substrate 53 is guided along directions E using alignment means so that substrate 53 is oriented reliably relative to support 81.

The alignment means are preferably formed by a chamfered column 80, mounted in the extension of a pin 85 secured approximately perpendicular to support 81, which cooperates with one of the recesses 59 made in substrate 53 in step 5. Method 1 preferably includes three alignment means 80, 59 so as to improve guiding in first phase 25.

Secondly and lastly, by continuing to bring substrate 53 closer to support 81 along translation D, substrate 53, then each part 51 slides respectively against each pin 85 and each fork 87, both of which are secured to support 81. The second time period ends when substrate 53 and each part 51 abut approximately against the shoulder 88 of each pin 85 and the shoulder of each fork 87 formed in the bottom of space 84 delimited by teeth 82.

Figure 5:
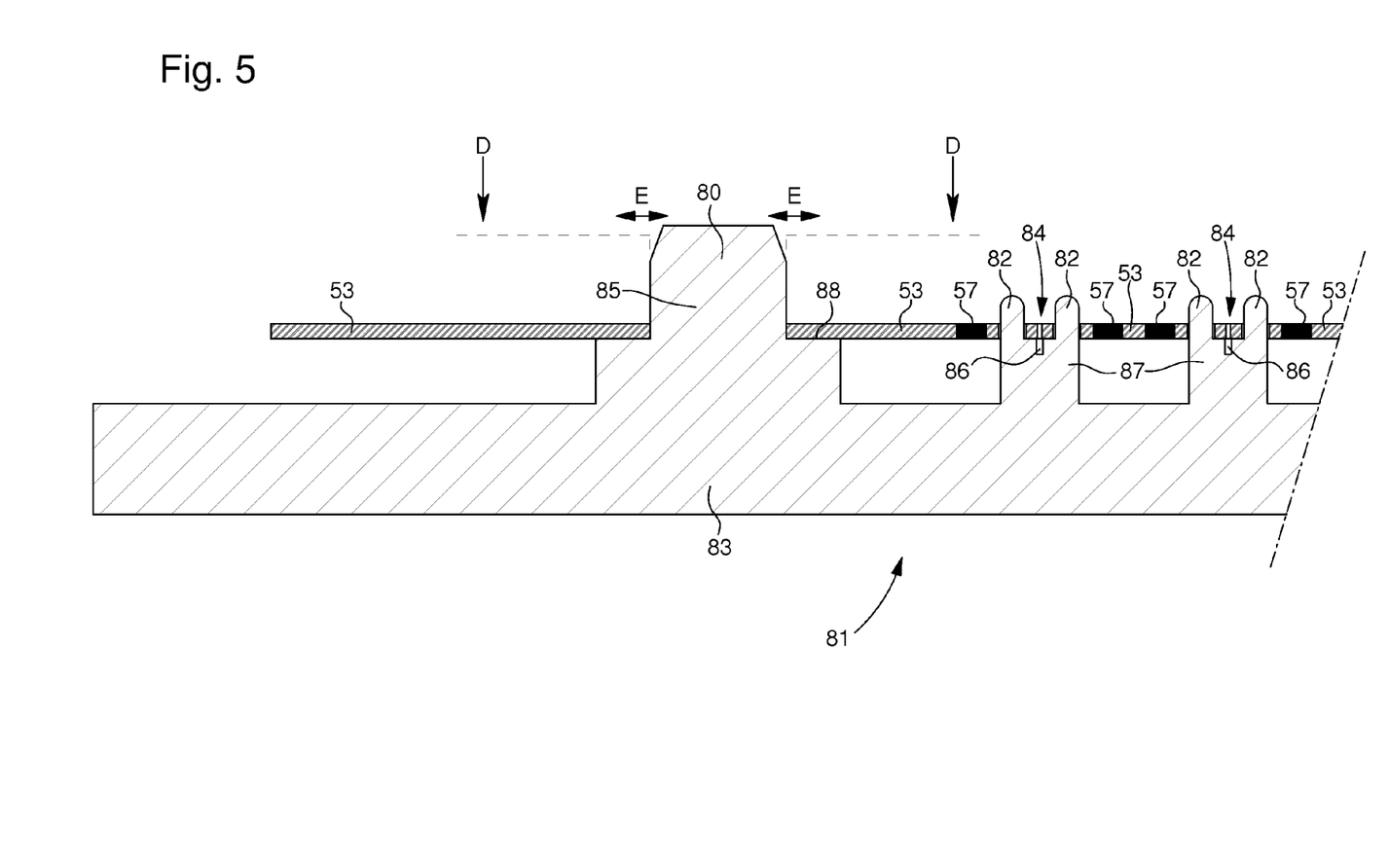
FIG. 5 is a diagram of a step of assembly onto a support according to the invention.

As visible in FIG. 5 at the end of phase 25, substrate 53 and each part 51 (still secured to substrate 53) are placed in a stable manner and the only degree of freedom they have is translation D upwards. In the example illustrated on the pattern at the top right of FIG. 2, three teeth 82 of a fork 87 can be seen, whose shape corresponds to the free space between two arms of escape wheel 51. Of course, forks 87 will be adapted depending upon the part 51 being manufactured. Support 81 is preferably formed from a material that does not damage part 51 like, for example, a plastic polymer.

Alignment means 80, 59 are preferably located higher vertically then pins 85 and forks 87 in order to guarantee the consecutiveness of the first stage then the second stage.

Figure 6:
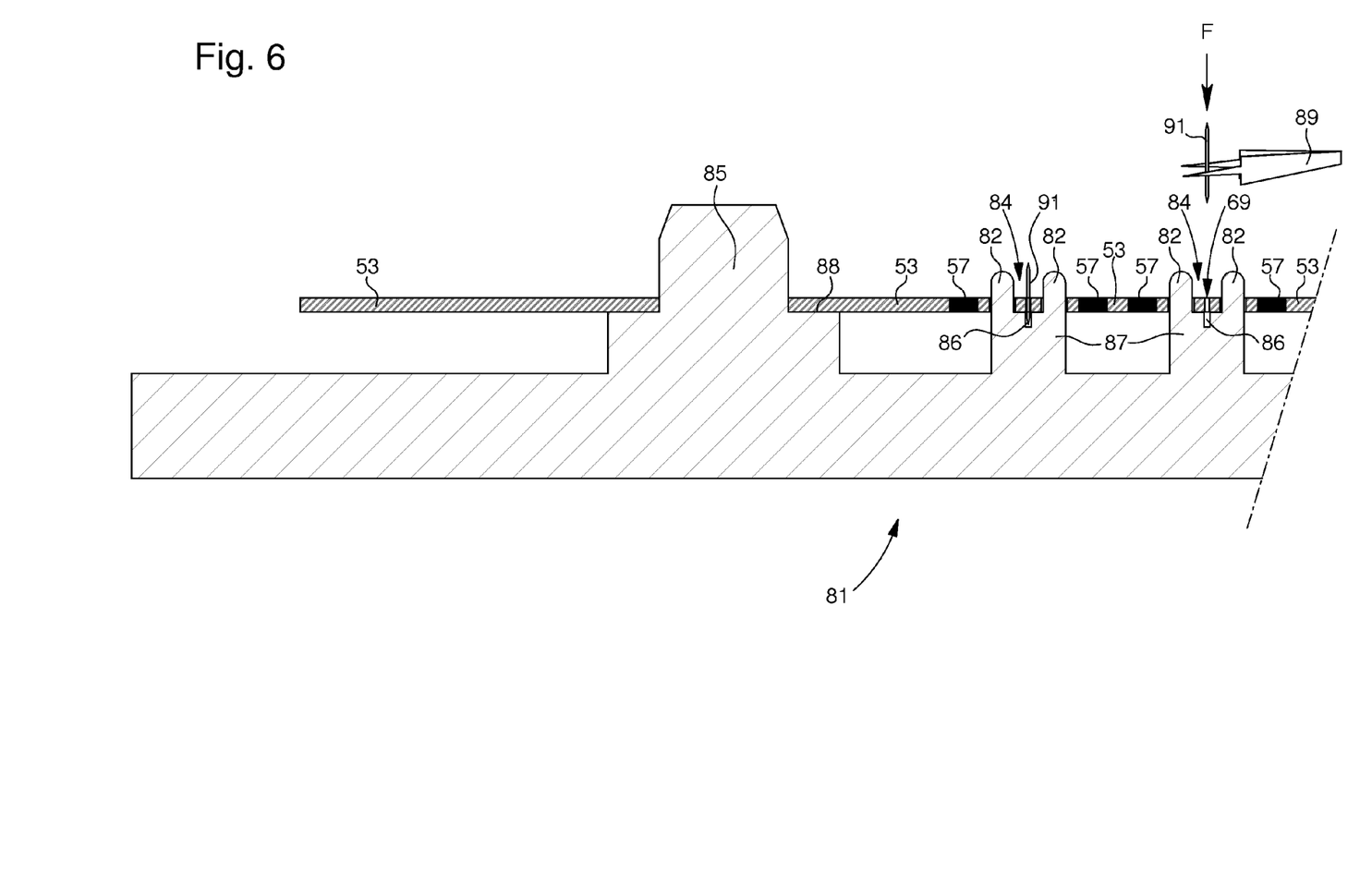
FIG. 6 is a diagram of a clip assembly step according to the invention.

In the second phase 27 of third step 13, a clip 91 is assembled onto each part 51. In the example illustrated in FIG. 6, a first assembled part 51 and a second part 51 further to the right, whose clip 91 has not yet been assembled can be seen. Of course, this FIG. 6 is used for better comprehension. Indeed, assembly of clips 91 should not be limited to assembly one-by-one using tweezers 89, but could of course be achieved at the same time for each part 51 using an automated machine.

As can be seen in the part 51 to the right which is not assembled, first of all, clip 91 is moved along translation F towards the pierced centre 69 of the part 51 contained in space 84 delimited by teeth 82. Preferably, the maximum translation of clip 91 relative to centre 69 is delimited by the height of hole 86 made in the extension of space 84, which allows clip 91 to be reliably mounted relative to part 51.

Secondly, once all of clips 91 have been placed on all of parts 51, clip 91 and part 51 are definitively secured to each other, for example, by being heated in a furnace so that the adhesive, present on each clip 91, polymerises, which has the effect of securing each clip 91 in its associated centre 69.

At the end of step 13, one thus obtains a substrate 53, wherein the part 51 of each pattern 50 is pre-assembled. Advantageously, according to the invention, the dozens of parts 51 can thus still be handled together and can be supplied with or without support 81 directly to the production line of a device, such as for example a timepiece movement.

The fourth and last step 11 consists in exerting a relative movement between part 51 and substrate 53 so as to break bridges of material 57. Advantageously, according to the invention, this movement can be achieved by pulling directly on clip 91, which allows each part 51 to be finally mounted without any direct handling of the micro-machinable material. Step 11 can thus be achieved manually using tweezers or an automated machine.

In the example illustrated in FIGS. 1 and 2, part 51 is an escape wheel and clip 91 is its pivoting pin. However, the invention is in no way limited to this and, by way of example, part 51 could be another type of gear train, a crown or even a balance spring-collet assembly, just as clip 91 could be a different functional part from a pivoting pin.

The second embodiment is provided for the case where the micro-machinable material has sufficient tribological features for the intended application of part 51. In the second embodiment, method 1 has the consecutive steps 3, 5, 7, 9, 13 and 11 as illustrated by a double line in FIG. 7. The first steps 3, 5 remain unchanged relative to the first embodiment. As shown in FIG. 7, instead of passing from step 5 to step 13 as in the first embodiment, the second embodiment passes first via steps 7 and 9 prior to passing to step 13, which advantageously means that a coating can be deposited on each of parts 51 of substrate 53.

According to the second embodiment, the third step 7 consists in mounting the etched substrate 53 on a base 55 so as to leave the top and bottom surfaces of substrate 53 accessible in order to prepare for deposition step 9. Step 7 includes phases 21 and 23.

Figure 3:
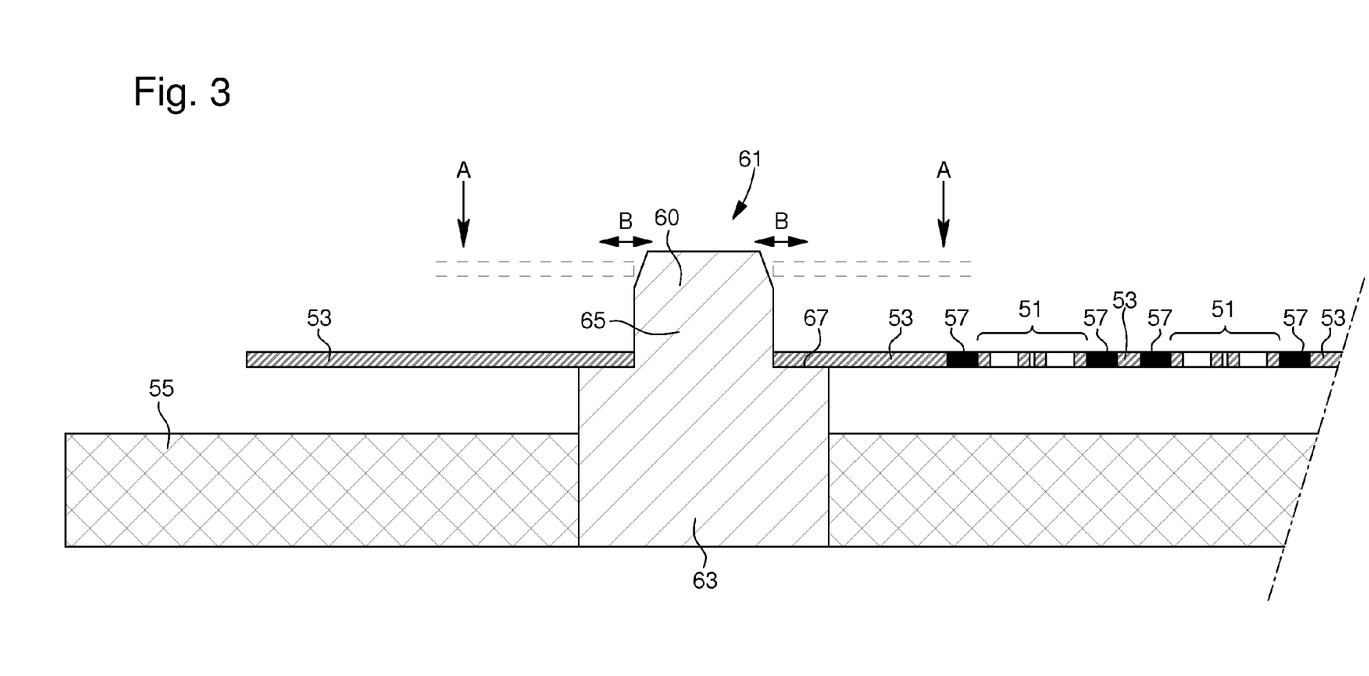
FIG. 3 is a diagram of a step of assembly onto a base according to the invention.

FIG. 3 illustrates an example base 55 according to the second embodiment. Base 55 is a plate, the material of which can withstand the temperatures of step 9, such as, for example, a ceramic. In order to keep substrate 53 high relative to base 55, the base has pins 61 for cooperating with holes 59 made in substrate 53 during step 5. For the same reasons as base 55, pins 61 are preferably made of tungsten or tantalum.

Preferably, each generally cylindrical pin 61 has a low part 63 connected to a high part 65 of smaller section by means of a shoulder 67. The low part 63 is mounted approximately perpendicularly in base 55 in a fixed manner. In the extension of the high part 65 there is a chamfered column 60 that belongs to alignment means cited below.

In the first phase 21, as seen in FIG. 3, by moving substrate 53 closer to base 55 along direction A, substrate 53 is guided along directions B using alignment means so that substrate 53 is reliably oriented relative to base 55.

The alignment means are preferably formed by the chamfered column 60 cooperating with one of recesses 59. Method 1 preferably includes three alignment means 60, 59 to improve guiding in first phase 21.

In a second phase 23, continuing to move closer along translation A, substrate 53 slides against each high part 65 of pins 61 until substrate 53 is approximately abutting against shoulder 67 of each pin 61. As seen in FIG. 3 at the end of step 7, substrate 53 is placed stably and its only degree of freedom is in translation A upwards.

In the example illustrated in FIG. 2, on patterns 50 at the bottom right, and at the top left, a variant can be seen of alignment means column 60-hole 59. This variant is provided where the space at the ends of substrate 53 means that holes 59 cannot be made. According to the variant, two columns 93, 97 are provided that each cooperate with an empty part of a pattern 50. The two patterns 50 are preferably as far as possible from each other and each is in proximity to the ends of substrate 53. In the example illustrated in FIG. 2, it can be seen that each column 93 and 97 of approximately trigonal shape cooperates with a different pattern 50 along a central symmetry in order to improve guiding in step 21. The symmetry is preferably achieved relative to the centre of substrate 53 and uses patterns 50 to the top left and bottom right of the example illustrated in FIG. 1.

Alignment means 60, 59, 93, 97 are preferably located higher vertically than pins 61 so as to guarantee the consecutiveness of phases 21 then 23.

Figure 4:
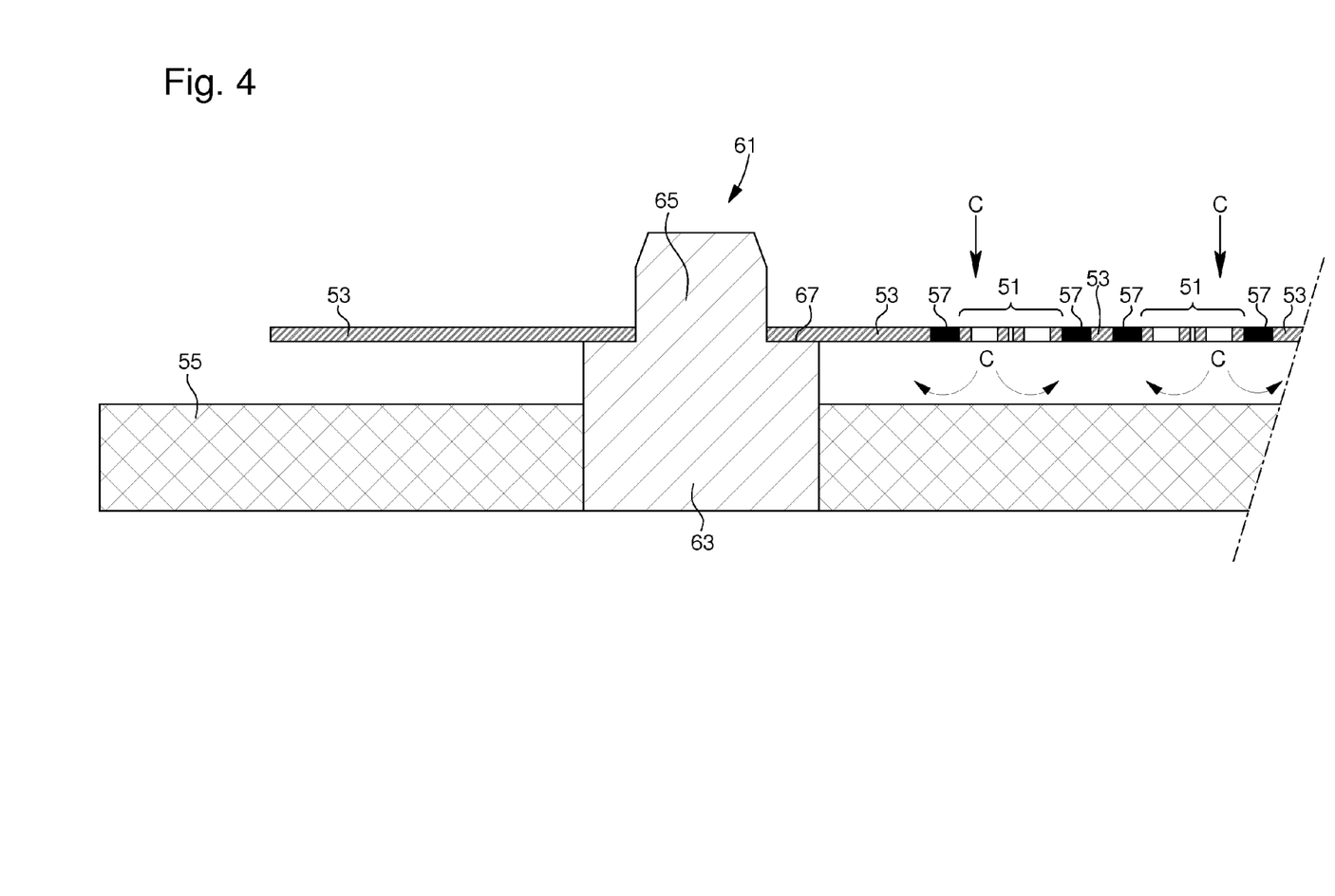
FIG. 4 is a diagram of a coating deposition step.

According to the second embodiment, the fourth step 9 consists in depositing a coating on the outer surface of each part 51. As explained above, the coating may, for example, be a carbon allotrope for improving the tribology of each part 51, particularly by reducing its friction coefficient. As illustrated in FIG. 4 by arrow C, in step 9 a coating is deposited below, across the thickness of and above substrate 53 via step 7 for placing substrate 53 high up and because substrate 53 was etched right through in step 5.

At the end of step 9, substrate 53 is removed from base 55, then the second embodiment implements step 13 in the same way as the first embodiment. At the end of step 13, a substrate 53 is thus obtained wherein the part 51 of micro-machinable material of each pattern 50 is coated with a deposition and pre-assembled with a clip 91. Advantageously according to the invention, dozens of parts 51 can thus still be handled together and can be supplied with or without support 81 directly to the assembly line of a device, such as for example, a timepiece movement.

The sixth and last step 11 consists in exerting a relative movement between part 51 and substrate 53 so as to break bridges of material 57. Advantageously according to the invention, this movement can be achieved by pulling directly on clip 91, which enables each part 51 to be finally assembled without any direct handling of the micro-machinable material and/or the deposited coating. Step 11 can thus be achieved manually using tweezers or using an automated machine. As for the first embodiment, the invention according to the second embodiment is not limited to an escape wheel as illustrated in FIGS. 1 and 2.

Of course, the present invention is not limited to the illustrated example but is capable of various variants and alterations which will appear to those skilled in the art. In particular, a third embodiment of method 1 could be envisaged that includes the consecutive steps 3, 5, 7, 9 and 11 as illustrated by a triple line in FIG. 7, which would produce a part 51 including a deposited coating but wherein step 11 would be made more difficult because of the lack of gripping means such as clip 91, which is present in the first and second embodiments. Step 11 could then consist in applying stress to bridges of material 57 so that they break in order to retrieve said part.

The three variants show that the invention can offer simplified organisation between each step because parts 51 are only removed from substrate 53 in the last step 11. The advantage of this is that dozens of parts 51 can be moved between each step by handling substrate 53 alone.

What is claimed is:

1. A method of manufacturing a mechanical part comprising the steps of:
   (a) providing a substrate of micro-machinable material;
   (b) etching, using photolithography, a pattern that includes the mechanical part, through the entire substrate;
   (c) assembling a clip on the mechanical part so that the mechanical part is ready to be mounted without the portion made of micro-machinable material having to be touched by a tool other than the clip, and mounting the substrate on a support fitted with forks, so that the forks cooperate with the mechanical part, wherein the clip is assembled on the mechanical part mounted against the support; and
   (d) releasing the mechanical part from the substrate so as to mount the mechanical part in a device.

2. The method according to claim 1, wherein step (c) includes the following additional substeps
   (i) guiding the substrate relative to the support using alignment means so as to orient the substrate in a predetermined manner; and
   (ii) sliding the substrate and the mechanical part respectively against at least one pin and the forks secured to the support so as to abut against a shoulder of the at least one pin and the forks, respectively, in order to prepare for assembly of the clip.

3. The method according to claim 2, wherein the alignment means are located higher than the at least one pin and the forks so as to guarantee the consecutiveness of substeps (i) then (ii).

4. The method according to claim 2, wherein the support includes several alignment means so as to improve the guiding in substep (i).

5. The method according to claim 2, wherein the alignment means include at least one column secured to the support for cooperating with a recess made in the substrate in step (b).

6. The method according to claim 5, wherein each recess is made in proximity to the ends of the substrate.

7. The method according to claim 5, wherein each recess corresponds to an empty space in the pattern.

8. The method according to claim 1, wherein, during step (b), at least one bridge of material is etched in the pattern so as to keep the mechanical part secured to the substrate.

9. The method according to claim 8, wherein said at least one bridge of material includes a narrow portion at an end connected to the pattern of the mechanical part for creating a zone of weakness that can facilitate step (d).

10. The method according to claim 8, wherein step (d) is achieved by relative movement between the mechanical part and the substrate in order to break said at least one bridge of material.

11. The method according to claim 1, wherein the substrate is thinned between step (a) and step (b) so as to adapt the final thickness of the mechanical part.

12. The method according to claim 1, wherein several parts are manufactured from the same substrate.

13. The method according to claim 1, wherein step (b) includes the following substeps
   (i) structuring a protective mask in a shape matching said mechanical part on the substrate;
   (ii) anisotropic etching the substrate-mask assembly; and
   (iii) removing said protective mask.

14. The method according to claim 13, wherein said protective mask is made using a photosensitive resin.

15. The method according to claim 1, wherein said micro-machinable material is chosen from among the group consisting of crystalline silicon, crystalline silica and crystalline alumina.

16. The method according to claim 1, wherein the device is a timepiece.

17. A method of manufacturing a mechanical part comprising the steps of:
   (a) providing a substrate of micro-machinable material;
   (b) etching, using photolithography, a pattern that includes the mechanical part, through the entire substrate;
   (c) assembling a clip on the mechanical part so that the mechanical part is ready to be mounted without the portion made of micro-machinable material having to be touched by a tool other than the clip; and
   (d) releasing the mechanical part from the substrate so as to mount the mechanical part in a device, wherein between steps (b) and (c), the method includes the following additional steps of
   (e) mounting the etched substrate on a base so as to leave top and bottom surfaces thereof accessible for coating of both the top and bottom surfaces; and
   (f) depositing a coating of better tribological quality than the micro-machinable material on an external surface of the mechanical part.

18. The method according to claim 17, wherein step (f) includes the following additional substeps
   (i) guiding the substrate relative to the base using alignment means so as to orient the substrate in a predetermined manner; and
   (ii) sliding the substrate against at least one pin secured to the base until the substrate abuts against a shoulder of the at least one pin made at a distance from said support so as to keep the substrate high relative to said support.

19. The method according to claim 18, wherein the alignment means are located higher than said at least one pin so as to guarantee the consecutiveness of substeps (i) then (ii).

20. The method according to claim 18, wherein the base has several alignment means for improving the guiding in substep (i).

21. The method according to claim 18, wherein the alignment means include at least one column secured to the base for cooperating with a recess made in the substrate in step (b).

22. The method according to claim 21, wherein each recess is made in proximity to ends of the substrate.

23. The method according to claim 21, wherein each recess corresponds to an empty space in the pattern.

* * * * *